(12) United States Patent
Nakamura et al.

(10) Patent No.: US 9,516,765 B2
(45) Date of Patent: Dec. 6, 2016

(54) METHOD FOR PRODUCING PRINTED WIRING BOARD

(71) Applicant: Ajinomoto Co., Inc., Chuo-ku (JP)

(72) Inventors: Shigeo Nakamura, Kawasaki (JP); Yukinori Morikawa, Kawasaki (JP); Tadahiko Yokota, Kawasaki (JP)

(73) Assignee: Ajinomoto Co., Inc., Chuo-ku (JP)

( * ) Notice: Subject to any disclaimer, the term of this patent is extended or adjusted under 35 U.S.C. 154(b) by 0 days.

(21) Appl. No.: 14/065,924

(22) Filed: Oct. 29, 2013

(65) Prior Publication Data

US 2014/0118964 A1 May 1, 2014

(30) Foreign Application Priority Data

Nov. 1, 2012 (JP) .................................. 2012-241869

(51) Int. Cl.
 *H05K 3/46* (2006.01)

(52) U.S. Cl.
 CPC ............. *H05K 3/465* (2013.01); *H05K 3/4661* (2013.01); *H05K 2201/0209* (2013.01); *Y10T 29/49165* (2015.01)

(58) Field of Classification Search
 CPC ........................... H05K 3/4655; H05K 3/4632
 USPC .............................. 361/748; 174/258; 29/852
 See application file for complete search history.

(56) References Cited

U.S. PATENT DOCUMENTS

| | | | |
|---|---|---|---|
| 6,376,053 B1 * | 4/2002 | Nakamura et al. ............ 428/209 |
| 6,405,431 B1 * | 6/2002 | Shin et al. ....................... 29/852 |
| 8,357,443 B2 * | 1/2013 | Narahashi et al. ........... 428/41.8 |
| 8,357,859 B2 * | 1/2013 | Wakabayashi et al. ....... 174/258 |
| 8,382,996 B2 * | 2/2013 | Narahashi et al. .............. 216/13 |
| 8,484,839 B2 * | 7/2013 | Lin et al. ......................... 29/847 |
| 8,584,352 B2 * | 11/2013 | Narahashi et al. .............. 29/846 |
| 2002/0016018 A1 * | 2/2002 | Oka et al. ........................ 438/64 |

(Continued)

FOREIGN PATENT DOCUMENTS

| | | |
|---|---|---|
| JP | 2008-037957 | 2/2008 |
| JP | 2010056274 A * | 3/2010 |

(Continued)

OTHER PUBLICATIONS

Office Action mailed Jun. 28, 2016 issued in corresponding Chinese patent application No. 2012-241869 (with English translation).

*Primary Examiner* — Jeremy C Norris
*Assistant Examiner* — Nathan Milakovich
(74) *Attorney, Agent, or Firm* — Oblon, McClelland, Maier & Neustadt, L.L.P.

(57) ABSTRACT

A method for producing a printed wiring board which is capable of forming an insulating layer having a surface with low roughness and high adhesion strength to a conductive layer and of achieving an excellent performance in removal of smear, involves the following steps (A) to (F) in this order: (A) laminating, onto an internal layer circuit substrate, a resin sheet with a support which includes a support and a resin composition layer in contact with the support so that the resin composition layer is in contact with the internal layer circuit substrate; (B) thermally curing the resin composition layer of the resin sheet with a support to form an insulating layer; (C) perforating the insulating layer to form a via hole; (D) performing a desmear treatment; (E) peeling the support; and (F) forming a conductive layer on a surface of the insulating layer.

10 Claims, 2 Drawing Sheets

(56) References Cited

U.S. PATENT DOCUMENTS

| | | |
|---|---|---|
| 2004/0099367 A1 | 5/2004 | Nakamura et al. |
| 2005/0175824 A1* | 8/2005 | Wakizawa et al. ............ 428/209 |
| 2009/0104429 A1* | 4/2009 | Goto et al. ................. 428/319.3 |
| 2010/0230142 A1* | 9/2010 | Bamba et al. ................. 174/255 |
| 2011/0036625 A1* | 2/2011 | Narahashi .............. H05K 3/381 |
| | | 174/261 |
| 2012/0247814 A1* | 10/2012 | Shimizu et al. .............. 174/251 |
| 2013/0062108 A1* | 3/2013 | Kondo ................. H05K 3/4069 |
| | | 174/258 |
| 2013/0112459 A1* | 5/2013 | Aoshima et al. ............. 174/255 |
| 2013/0112460 A1* | 5/2013 | Aoshima et al. ............. 174/255 |
| 2013/0180760 A1* | 7/2013 | Aoshima et al. ............. 174/250 |
| 2013/0199830 A1* | 8/2013 | Morita et al. ................ 174/258 |
| 2015/0016072 A1* | 1/2015 | Iwayama et al. ............. 361/748 |

FOREIGN PATENT DOCUMENTS

| | | |
|---|---|---|
| JP | 2011-171528 A | 9/2011 |
| JP | 2011-178857 A | 9/2011 |
| WO | 01/97582 A1 | 12/2001 |
| WO | WO 2012033152 A1 * | 3/2012 |

* cited by examiner

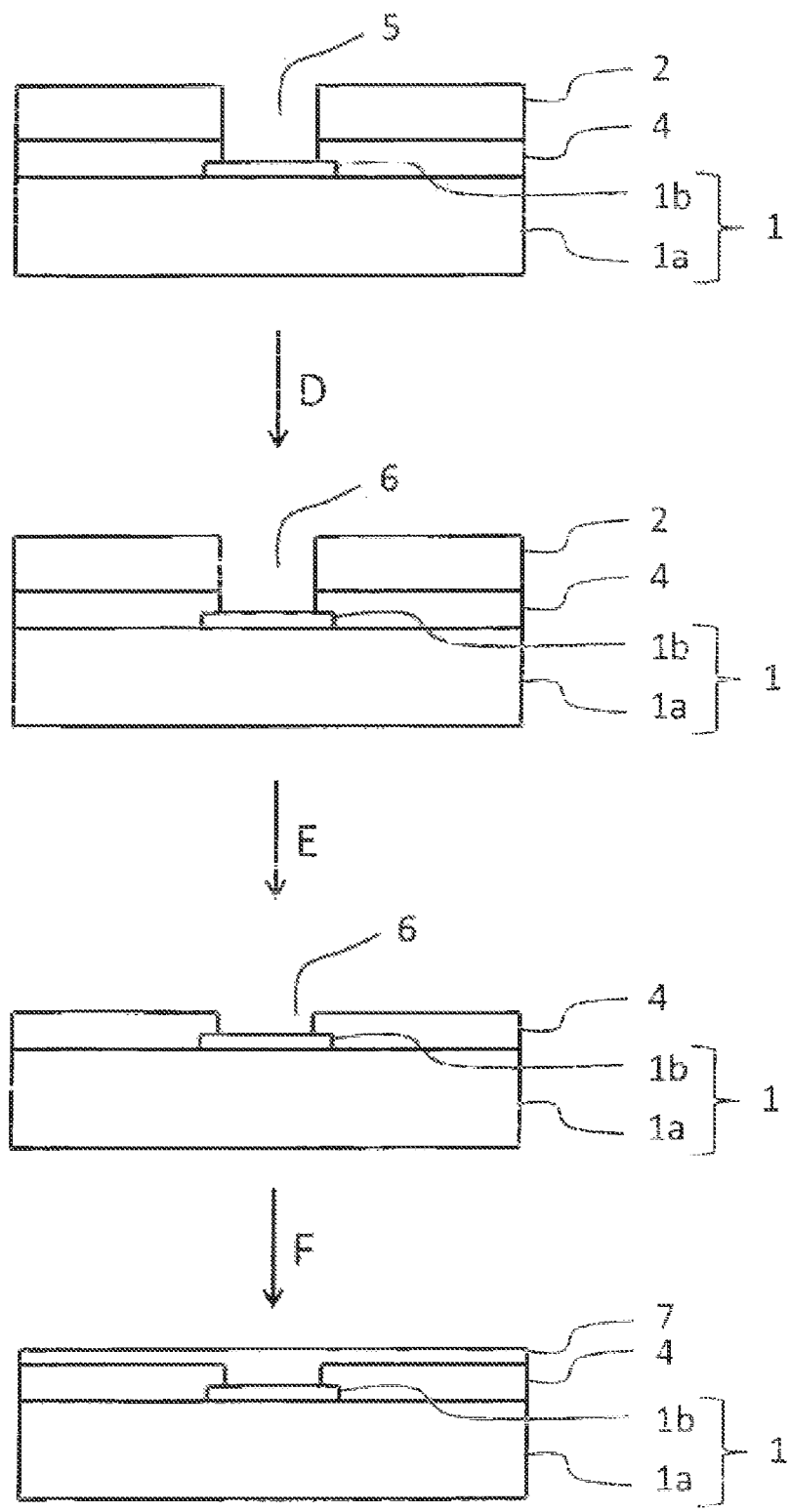

METHOD FOR PRODUCING PRINTED WIRING BOARD

CROSS REFERENCES TO RELATED APPLICATIONS

This application claims priority to Japanese Patent Application No. 2012-241869, filed on Nov. 1, 2012, which is incorporated herein by reference in its entirety.

BACKGROUND OF THE INVENTION

1. Field of the Invention

The present invention relates to methods for producing a printed wiring board.

2. Discussion of the Background

Printed wiring boards widely used for various electronic instruments are required to have thin layers and fine wiring circuits to achieve downsizing and high functionalization of electronic instruments. As a technique of producing a printed wiring board, there is known a production method which uses a build-up process of alternately layering an insulating layer and a conductive layer on an internal layer circuit substrate.

In the production method using the build-up process, an insulating layer is formed, for example, by laminating a resin composition layer on an internal layer circuit substrate with an adhesive film having the resin composition layer and thermally curing the resin composition layer. Subsequently, the formed insulating layer is perforated to form a via hole, and subjected to desmear treatment to simultaneously perform removal of a resin residue (smear) inside the via hole and roughening of the surface of the insulating layer (see, for example, JP-A-2008-37957, which is incorporated herein by reference in its entirety).

SUMMARY OF THE INVENTION

In the production method using the build-up process, a conductive layer is formed on a surface of the insulating layer after the desmear treatment. At this time, large irregularities of the surface of the insulating layer after the desmear treatment might prevent formation of fine wiring. Therefore, it is desirable that the roughness of the surface of the insulating layer is kept low so long as sufficient adhesion strength to the conductive layer can be achieved. For example, when an insulating layer is formed using a resin composition having a high resistance to the desmear treatment, the roughness of the surface of the insulating layer can be kept low. However, according to such an approach, the performance in removal of smear inside the via hole (particularly, at the bottom of the via hole) might be reduced.

On the other hand, when a relatively intensive desmear treatment condition is adopted to enhance removal of smear, the roughness of the surface of an insulating layer becomes high, resulting in a disadvantage in the formation of fine wiring. Furthermore, it has been found in such a case that if an insulating layer is formed using a resin composition having a high content of an inorganic filler, the adhesion strength between the insulating layer and a conductive layer tends to be reduced even though the roughness of the surface of the insulating layer is high.

The present invention has been made in view of the above circumstances.

Accordingly, it is an object of the present invention to provide a method for producing a printed wiring board, which is capable of forming an insulating layer having a surface with low roughness and high adhesion strength to a conductive layer and of achieving an excellent performance in removal of smear.

This and other objects, which will become apparent during the following detailed description, have been achieved by the inventors' discovery that the object can be achieved by producing a printed wiring board using a specific method described below.

Specifically, the present invention provides the following embodiments:

(1) A method for producing a printed wiring board, comprising the following steps (A) to (F) in this order:

(A) laminating, onto an internal layer circuit substrate, a resin sheet with a support which includes a support and a resin composition layer in contact with the support, so that the resin composition layer is in contact with the internal layer circuit substrate;

(B) thermally curing the resin composition layer of the resin sheet with a support to form an insulating layer;

(C) perforating the insulating layer to form a via hole;

(D) performing a desmear treatment;

(E) peeling the support; and (F) forming a conductive layer on a surface of the insulating layer.

(2) The method for producing a printed wiring board according to (1), wherein the desmear treatment in the step (D) is a wet desmear treatment, a dry desmear treatment, or a combination thereof (3) The method for producing a printed wiring board according to (1) or (2), wherein the step (F) comprises performing a roughening treatment of the surface of the insulating layer, and wet plating the surface of the insulating layer to form the conductive layer, in this order.

(4) The method for producing a printed wiring board according to (1) or (2), wherein the step (F) comprises dry plating the surface of the insulating layer to form a metal layer, and wet plating a surface of the metal layer to form the conductive layer, in this order.

(5) The method for producing a printed wiring board according to any one of (1) to (4), wherein the resin composition layer of the resin sheet with a support comprises an epoxy resin, a curing agent, and an inorganic filler.

(6) The method for producing a printed wiring board according to (5), wherein the curing agent comprises an active ester-based curing agent.

(7) The method for producing a printed wiring board according to (5) or (6), wherein an average particle diameter of the inorganic filler is 0.01 µm to 3 µm.

(8) The method for producing a printed wiring board according to any one of (5) to (7), wherein a content of the inorganic filler in the resin composition layer is 40% by mass to 95% by mass when a content of nonvolatile components in the resin composition layer is defined as 100% by mass.

(9) The method for producing a printed wiring board according to any one of (5) to (8), wherein a surface of the inorganic filler is treated with a surface treatment agent.

(10) A printed wiring board produced by the method according to any one of (1) to (9).

(11) A semiconductor device, comprising the printed wiring board according to (10).

The present invention can provide a method for producing a printed wiring board, which is capable of forming an insulating layer having a surface with low roughness and high adhesion strength to a conductive layer and of achieving an excellent performance in removal of smear.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIGS. 1a and 1b schematically depict one embodiment of the present method, in which:
- 1 is an internal layer circuit substrate;
- 1a is a substrate;
- 1b is a circuit;
- 2 is a support;
- 3 is a resin composition layer;
- 4 is an insulating layer;
- 5 is a via hole;
- 6 is a desmeared via hole; and
- 7 is a conductive layer.

DETAILED DESCRIPTION OF THE PREFERRED EMBODIMENTS

Figure 1A:
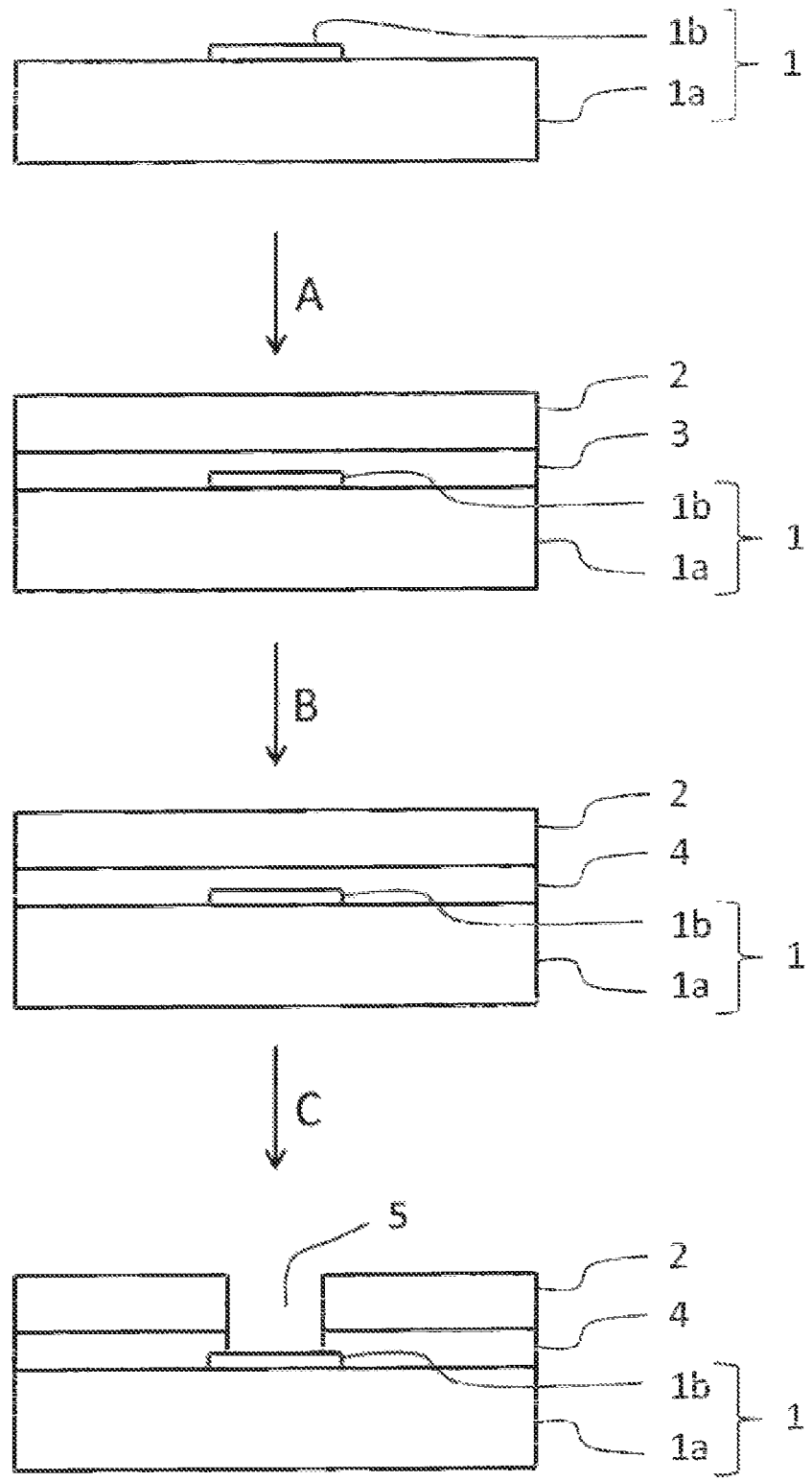

Hereinafter, the present invention will be described in detail in accordance with preferred embodiments.
Method for Producing Printed Wiring Board.

The method for producing a printed wiring board of the present invention comprises the following steps (A) to (F) in this order:

(A) laminating, onto an internal layer circuit substrate, a resin sheet with a support which includes a support and a resin composition layer in contact with the support, so that the resin composition layer is in contact with the internal layer circuit substrate;

(B) thermally curing the resin composition layer of the resin sheet with a support to form an insulating layer;

(C) perforating the insulating layer to form a via hole;

(D) performing a desmear treatment;

(E) peeling the support; and (F) forming a conductive layer on a surface of the insulating layer.

The phrase "comprises (comprising) steps in this order" or "includes (including) steps in this order" used in reference to the steps (A) to (F) in the present invention is not intended to prevent other steps from being included as long as each of the steps (A) to (F) is included and the steps (A) to (F) are performed in this order.

Hereinafter, the same shall apply to the phrase "comprises (comprising) in this order" or "includes (including) in this order" used in reference to the steps or the processes.
Resin Sheet with Support.

Before describing each step in detail, the resin sheet with a support used in the production method of the present invention will be described. The resin sheet with a support used in the production method of the present invention includes a support and a resin composition layer in contact with the support.
Support.

Examples of the support may include a film formed of a plastic material, a metal foil (such as copper foil and aluminum foil), and a release paper. A film formed of a plastic material is suitably used. Examples of the plastic material may include polyesters such as polyethylene terephthalate (hereinafter may be abbreviated as "PET") and polyethylene naphthalate (hereinafter may be abbreviated as "PEN"), polycarbonate (hereinafter may be abbreviated as "PC"), acrylics such as polymethyl methacrylate (PMMA), cyclic polyolefin, triacetylcellulose (TAC), polyether sulfide (PES), polyether ketone, and polyimide. Among them, polyethylene terephthalate or polyethylene naphthalate is preferable, and inexpensive polyethylene terephthalate is particularly preferable. In a preferred embodiment, the support is a polyethylene terephthalate film.

A surface of the support which is in contact with a resin composition layer may be subjected to a mat treatment or a corona treatment.

As the support, there may also be used a support with a release layer which is a support having a release layer on its surface to be in contact with a resin composition layer. Examples of a release agent used for a release layer of the support with a release layer may include one or more release agents selected from the group consisting of an alkyd resin, a polyolefin resin, a urethane resin, and a silicone resin.

As the support with a release layer, a commercially available product may be used in the present invention. Examples of the commercially available product may include "SK-1," "AL-5," and "AL-7" which are available from Lintec Corporation and are PET films with a release layer containing primarily an alkyd resin-based release agent.

Although the thickness of the support is not particularly limited, the thickness is preferably within a range of 10 μm to 70 μm, and more preferably within a range of 20 μm to 60 μm. When the support is a support with a release layer, the total thickness of the support with a release layer preferably falls with the above-described range.
Resin Composition Layer.

A resin composition used for the resin composition layer is not particularly limited as long as a cured product thereof may have sufficient hardness and insulation properties. For example, a resin composition containing (a) an epoxy resin, (b) a curing agent, and (c) an inorganic filler can be used. The resin composition used for the resin composition layer may further contain an additive such as a thermoplastic resin, an accelerator, a flame retardant, and a rubber particle, if necessary.

In the present invention, the content of each component constituting the resin composition is a value when the total content of nonvolatile components in the resin composition is defined as 100% by mass.

(a) Epoxy Resin.

Examples of the epoxy resin may include a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a spiro ring-containing epoxy resin, a cyclohexane dimethanol type epoxy resin, a naphthylene ether type epoxy resin, and a trimethylol type epoxy resin. The epoxy resin may be used alone or in combination of two or more kinds thereof.

The epoxy resin preferably contains an epoxy resin having two or more epoxy groups within the molecule. It is preferable that at least 50% by mass of the epoxy resin is an epoxy resin having two or more epoxy groups within the molecule when a content of nonvolatile components in the epoxy resin is defined as 100% by mass. In particular, it is preferable that the epoxy resin contains an epoxy resin that has two or more epoxy groups within the molecule and is liquid at a temperature of 20° C. (hereinafter referred to as "liquid epoxy resin") and an epoxy resin that has three or more epoxy groups within the molecule and is solid at a temperature of 20° C. (hereinafter referred to as "solid epoxy resin"). When a liquid epoxy resin and a solid epoxy resin are used in combination as the epoxy resin, a resin composition having excellent flexibility can be obtained. Further, the rupture strength of the cured product of the resin composition is improved.

As the liquid epoxy resin, a bisphenol A type epoxy resin, a bisphenol F type epoxy resin, a phenol novolac type epoxy resin, or a naphthalene type epoxy resin is preferable, and a naphthalene type epoxy resin is more preferable. Specific examples of the liquid epoxy resin may include "EXA4032SS" (naphthalene type epoxy resin), "HP4032" (naphthalene type epoxy resin), and "HP4032D" (naphthalene type epoxy resin) which are available from DIC Corporation, "jER828EL" (bisphenol A type epoxy resin), "jER807" (bisphenol F type epoxy resin), and "jER152" (phenol novolac type epoxy resin) which are available from Mitsubishi Chemical Corporation, and "ZX1059" (mixed product of a bisphenol A type epoxy resin and a bisphenol F type epoxy resin) available from Nippon Steel Chemical Co., Ltd. These may be used alone or in combination of two or more kinds thereof.

As the solid epoxy resin, a tetrafunctional naphthalene type epoxy resin, a cresol novolac type epoxy resin, a dicyclopentadiene type epoxy resin, a trisphenol type epoxy resin, a naphthol novolac type epoxy resin, a biphenyl type epoxy resin, or a naphthylene ether type epoxy resin is preferable, and a tetrafunctional naphthalene type epoxy resin, a biphenyl type epoxy resin, or a naphthylene ether type epoxy resin is more preferable. Specific examples of the solid epoxy resin may include "HP-4700" (tetrafunctional naphthalene type epoxy resin), "N-690" (cresol novolac type epoxy resin), "N-695" (cresol novolac type epoxy resin), "HP-7200" (dicyclopentadiene type epoxy resin), "EXA7311" (naphthylene ether type epoxy resin), "EXA7310" (naphthylene ether type epoxy resin), and "EXA7311-G3" (naphthylene ether type epoxy resin) which are available from DIC Corporation, "EPPN-502H" (trisphenol type epoxy resin), "NC7000L" (naphthol novolac type epoxy resin), "NC3000H" (biphenyl type epoxy resin), "NC3000" (biphenyl type epoxy resin), "NC3000L" (biphenyl type epoxy resin), and "NC3100" (biphenyl type epoxy resin) which are available from NIPPON KAYAKU Co., Ltd., "ESN475" (naphthol novolac type epoxy resin) and "ESN485" (naphthol novolac type epoxy resin) which are available from Tohto Kasei Co., Ltd., "ESN475V" (naphthol novolac type epoxy resin) available from Nippon Steel Chemical Co., Ltd., and "YX4000H" (biphenyl type epoxy resin) and "YX4000HK" (bixylenol type epoxy resin) which are available from Mitsubishi Chemical Corporation.

When the liquid epoxy resin and the solid epoxy resin are used in combination as the epoxy resin, a mass ratio thereof (liquid epoxy resin:solid epoxy resin) is preferably within a range of 1:0.1 to 1:5. When the mass ratio of the liquid epoxy resin to the solid epoxy resin falls within such a range, there may be obtained the following effects: i) moderate adhering properties can be obtained when the resin composition is used in a resin sheet form; ii) sufficient flexibility, which results in improvement in handleability, can be obtained when the resin composition is used in a resin sheet form; iii) a cured product having sufficient rupture strength can be obtained, and the like. From the viewpoints of the effects i) to iii) as noted above, the mass ratio of the liquid epoxy resin to the solid epoxy resin (liquid epoxy resin:solid epoxy resin) is more preferably within a range of 1:0.3 to 1:4.5, and still more preferably within a range of 1:0.6 to 1:4.

The content of the epoxy resin in the resin composition is preferably 3% by mass to 35% by mass, more preferably 5% by mass to 30% by mass, still more preferably 5% by mass to 25% by mass, and particularly preferably 7% by mass to 20% by mass.

(b) Curing Agent.

The curing agent is not particularly limited as long as it has a function of curing an epoxy resin. Examples thereof may include a phenol-based curing agent, a naphthol-based curing agent, an active ester-based curing agent, a benzoxazine-based curing agent, and a cyanate ester-based curing agent. The curing agent may be used alone or in combination of two or more kinds thereof.

From the viewpoints of heat resistance and water resistance, the phenol-based curing agent and the naphthol-based curing agent are preferably a phenol-based curing agent having a novolac structure and a naphthol-based curing agent having a novolac structure, respectively. From the viewpoint of adhesion strength to a conductive layer, a nitrogen-containing phenol-based curing agent is preferable, and a triazine skeleton-containing phenol-based curing agent is more preferable. Among them, a triazine skeleton-containing phenol novolac resin is preferably used for a curing agent from the viewpoint of highly satisfying heat resistance, water resistance, and adhesion strength to a conductive layer.

Specific examples of the phenol-based curing agent and the naphthol-based curing agent may include "MEH-7700," "MEH-7810," and "MEH-7851" which are available from Meiwa Plastic Industries, Ltd., "NHN," "CBN," and "GPH" which are available from NIPPON KAYAKU Co., Ltd., "SN170," "SN180," "SN190," "SN475," "SN485," "SN495," "SN375," and "SN395" which are available from Tohto Kasei Co., Ltd., and "LA7052," "LA7054," "LA3018," and "LA1356" which are available from DIC Corporation.

From the viewpoint of enhancing the adhesion strength to a conductive layer, an active ester-based curing agent is also preferable. The active ester-based curing agent also has an effect of keeping low the roughness of a surface of an insulating layer after roughening treatment. Specifically, the active ester-based curing agent can provide an insulating layer having a surface with low roughness and high adhesion strength to a conductive layer. The active ester-based curing agent has an excellent effect as above, but also has a problem of resulting in the occurrence of a resin residue (smear) that is difficult to be removed in a desmear treatment. A relative intensive desmear treatment condition can be adopted to remove smear. However, in that case, the roughness of the surface of the insulating layer becomes high, resulting in that the excellent effect of the active ester-based curing agent itself is diminished.

Although details will be described below, the method for producing a printed wiring board of the present invention can enhance performance in removal of smear while maintaining low roughness of the surface of the insulating layer. Therefore, in the present invention, the excellent effect which is originally provided by the active ester-based curing agent can be advantageously maintained.

Although the active ester-based curing agent is not particularly limited, a compound having two or more highly reactive ester groups within the molecule is generally preferably used, such as phenol esters, thiophenol esters, N-hydroxyamine esters, and esters of heterocyclic hydroxy compounds. The active ester-based curing agent is preferably obtained by condensation reaction of a carboxylic acid compound and/or a thiocarboxylic acid compound with a hydroxy compound and/or a thiol compound. Particularly, from the viewpoint of enhancing the heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound or the naphthol compound may include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac.

The active ester-based curing agent is preferably an active ester compound containing a dicyclopentadienyl diphenol structure, an active ester compound containing a naphthalene structure, an active ester compound containing an acetylated material of phenol novolac, or an active ester compound containing a benzoylated material of phenol novolac. Among these, an active ester compound containing a napthalene structure or an active ester compound containing a dicyclopentadienyl diphenol structure is more preferable.

Examples of a commercially available products of the active ester-based curing agent may include "EXB9451," "EXB9460," "EXB9460S," and "HPC-8000-65T" (available from DIC Corporation) which are the active ester compound containing a dicyclopentadienyl diphenol structure, "EXB9416-70BK" (available from DIC Corporation) which is an active ester compound containing a naphthalene structure, "DC808" (available from Mitsubishi Chemical Corporation) which is an active ester compound containing an acetylated material of phenol novolac, and "YLH1026" (available from Mitsubishi Chemical Corporation) which is an active ester compound containing a benzoylated material of phenol novolac.

Specific examples of the benzoxazine-based curing agent may include "HFB2006M" available from Showa High Polymer Co., Ltd., and "P-d" and "F-a" which are available from Shikoku Chemicals Corporation.

Examples of the cyanate ester-based curing agent may include: a difunctional cyanate resin such as bisphenol A dicyanate, polyphenol cyanate (oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate resin derived from phenol novolac, cresol novolac and so on; and a prepolymer in which these cyanate resins are partly triazinized. Specific examples of the cyanate ester-based curing agent may include "PT30" and "PT60" (both of which are a phenol novolac type polyfunctional cyanate ester resin) and "BA230"" (a prepolymer in which bisphenol A dicyanate is partly or entirely triazinized to form a trimer) which are available from Lonza Japan Ltd.

The quantitative ratio of the epoxy resin to the curing agent, in terms of a ratio of (the total number of epoxy groups in the epoxy resin):(the total number of reactive groups in the curing agent), is preferably within a range of 1:0.2 to 1:2, more preferably within a range of 1:0.3 to 1:1.5, and still more preferably within a range of 1:0.4 to 1:1. The reactive group of the curing agent is an active hydroxyl group, an active ester group, or the like, and differs depending on the kind of the curing agent. The total number of epoxy groups in the epoxy resin is a value obtained by dividing the mass of solid content in each epoxy resin by respective epoxy equivalent weights and summing the calculated values for all epoxy resins. The total number of reactive groups in the curing agent is a value obtained by dividing the mass of solid content in each curing agent by respective reactive group equivalent weights and summing the calculated values for all curing agents. When the quantitative ratio of the epoxy resin to the curing agent falls within such a range, the heat resistance of the cured product of the resin composition would be improved.

As described above, from the viewpoint of obtaining an insulating layer having a surface with low roughness and high adhesion strength to a conductive layer, the curing agent preferably contains an active ester-based curing agent. The ratio of the active ester-based curing agent in the entire curing agent is preferably 10% or more, more preferably 30% or more, still more preferably 50% or more, and particularly preferably 60% or more, based on the number of reactive groups of the curing agent. The upper limit of the ratio is not particularly limited, and may be 100%. From the viewpoint of improving the curing reactivity, the ratio is preferably 90% or less, and more preferably 80% or less. When a mixture of an active ester-based curing agent and other curing agent is used as the curing agent, it is preferable that the other curing agent is a phenol-based curing agent or a naphthol-based curing agent from the viewpoint of achieving an insulating layer having a surface with low roughness and high adhesion strength to a conductive layer while obtaining a sufficient pot life of the composition.

(c) Inorganic Filler.

Examples of the inorganic filler may include silica, alumina, barium sulfate, talc, clay, a mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. Among them, silica is particularly suitable, such as amorphous silica, fused silica, crystalline silica, synthetic silica, and hollow silica. Spherical silica is preferable as the silica. The inorganic filler may be used alone or in combination of two or more kinds thereof. Examples of commercially available spherical fused silica may include "SOC2" and "SOC 1" which are available from Admatechs Company Limited.

The average particle diameter of the inorganic filler is preferably within a range of 0.01 μm to 3 μm, more preferably within a range of 0.05 μm to 2 μm, still more preferably within a range of 0.1 μm to 1 μm, and particularly preferably within a range of 0.3 μm to 0.8 μm. The average particle diameter of the inorganic filler can be measured by a laser diffraction and scattering method on the basis of the Mie scattering theory. Specifically, the particle size distribution of the inorganic filler is prepared on the volume basis using laser diffraction and scattering particle size distribution measuring device, and the median diameter thereof can be measured as an average particle diameter. As a measurement sample, there can be preferably used a dispersion in which the inorganic filler is dispersed in water by ultrasonification. As the laser diffraction and scattering particle size distribution measuring device, LA-500 manufactured by Horiba, Ltd., or the like can be used.

To improve humidity resistance, the inorganic filler is preferably treated with one kind or two or more kinds of surface treatment agents such as an aminosilane-based coupling agent, an epoxysilane-based coupling agent, a mercaptosilane-based coupling agent, a silane-based coupling agent, an organosilazane compound, and a titanate-based coupling agent. Examples of a commercially available surface treatment agent may include "KBM403" (3-glycidoxypropyltrimethoxysilane) available from Shin-Etsu Chemical Co., Ltd., "KBM803" (3-mercaptopropyltrimethoxysilane) available from Shin-Etsu Chemical Co., Ltd., "KBE903" (3-aminopropyltriethoxysilane) available from Shin-Etsu Chemical Co., Ltd., "KBM573" (N-phenyl-3-aminopropyltrimethoxysilane) available from Shin-Etsu Chemical Co., Ltd., and "SZ-31" (hexamethyldisilazane) available from Shin-Etsu Chemical Co., Ltd.

With regard to the inorganic filler the surface of which is treated with the surface treatment agent, the amount of carbon per unit surface area of the inorganic filler can be measured after washing treatment with a solvent (for example, methyl ethyl ketone (MEK)). Specifically, a sufficient amount of MEK is added, as the solvent, to the inorganic filler the surface of which is treated with a surface treatment agent, and the resultant mixture is subjected to ultrasonic washing at 25° C. for 5 minutes. A supernatant liquid is removed and a solid content is dried. Thereafter, the amount of carbon per unit surface area of the inorganic filler can be measured with a carbon analyzer. As the carbon analyzer, "EMIA-320V" manufactured by Horiba, Ltd., or the like can be used.

From the viewpoint of improving the dispersibility of the inorganic filler, the amount of carbon per unit surface area of the inorganic filler is preferably 0.02 mg/m$^2$ or more, more preferably 0.1 mg/m$^2$ or more, and still more preferably 0.2 mg/m$^2$ or more. On the other hand, in terms of preventing an increase in the melt viscosity of a resin varnish and the melt viscosity in a sheet form, the amount of carbon per unit surface area of the inorganic filler is preferably 1 mg/m$^2$ or less, more preferably 0.8 mg/m$^2$ or less, and still more preferably 0.5 mg/m$^2$ or less.

As described above, the present inventors have found that when an insulating layer is formed using a resin composition having a high content of an inorganic filler, the adhesion strength between the insulating layer and a conductive layer is likely to be reduced. However, the method for producing a printed wiring board of the present invention can achieve sufficient adhesion strength between the insulating layer and the conductive layer even when the resin composition having a high content of an inorganic filler is used.

From the viewpoint of preventing the occurrence of cracks and circuit distortions, which are caused by a difference of thermal expansion between the insulating layer and the conductive layer, by reducing the thermal expansion coefficient of the insulating layer, the content of the inorganic filler in the resin composition is preferably 40% by mass or more, more preferably 50% by mass or more, still more preferably 60% by mass or more, and particularly preferably 65% by mass or more.

In the method for producing a printed wiring board of the present invention, the content of the inorganic filler in the resin composition can be further increased without a reduction in the adhesion strength between the insulating layer and the conductive layer. For example, the content of the inorganic filler in the resin composition may be increased to 66% by mass or more, 68% by mass or more, 70% by mass or more, 72% by mass or more, or 74% by mass or more.

From the viewpoint of mechanical strength of the insulating layer, the upper limit of content of the inorganic filler is preferably 95% by mass or less, more preferably 90% by mass or less, and still more preferably 85% by mass or less.

In one embodiment, the resin composition used for the resin composition layer contains the epoxy resin (a), the curing agent (b), and the inorganic filler (c) as described above. In particular, the resin composition preferably contains a mixture of a liquid epoxy resin and a solid epoxy resin (the mass ratio of a liquid epoxy resin to a solid epoxy resin is preferably 1:0.1 to 1:5, more preferably 1:0.3 to 1:4.5, and still more preferably 1:0.6 to 1:4) as the epoxy resin (a); one or more selected from the group consisting of an active ester-based curing agent, a phenol-based curing agent, and a naphthol-based curing agent as the curing agent (b); and silica as the inorganic filler (c), respectively. From the viewpoint of more advantageously forming an insulating layer having a surface with low roughness and high adhesion strength to a conductive layer, the resin composition more preferably contains a mixture of a liquid epoxy resin and a solid epoxy resin (the mass ratio of a liquid epoxy resin to a solid epoxy resin is preferably 1:0.1 to 1:5, more preferably 1:0.3 to 1:4.5, and still more preferably 1:0.6 to 1:4) as the epoxy resin (a); a curing agent containing an active ester-based curing agent as the curing agent (b); and silica as the inorganic filler (c), respectively. With regard also to a resin composition layer containing a combination of such particular components, suitable contents of the epoxy resin (a), the curing agent (b), and the inorganic filler (c) therein are as described above. In particular, it is preferable that the content of the epoxy resin (a) is 3% by mass to 35% by mass and the content of the inorganic filler (c) is 40% by mass to 90% by mass, and it is more preferable that the content of the epoxy resin (a) is 5% by mass to 25% by mass and the content of the inorganic filler (c) is 50% by mass to 90% by mass. For the content of the curing agent (b), the curing agent (b) is preferably contained in the resin composition so that the ratio of the total number of epoxy groups in the epoxy resin (a) to the total number of reactive groups in the curing agent (b) is preferably 1:0.2 to 1:2, more preferably 1:0.3 to 1:1.5, and still more preferably 1:0.4 to 1:1.

The resin composition used for the resin composition layer may further contain an additive such as a thermoplastic resin, an accelerator, a flame retardant, and a rubber particle, if necessary.

Examples of the thermoplastic resin may include a phenoxy resin, a polyvinyl acetal resin, a polyimide resin, a polyamideimide resin, a polyethersulfone resin, and a polysulfone resin. The thermoplastic resin may be used alone or in combination of two or more kinds thereof.

The polystyrene equivalent weight average molecular weight of the thermoplastic resin is preferably within a range of 8,000 to 70,000, more preferably within a range of 10,000 to 60,000, and still more preferably within a range of 20,000 to 60,000. The polystyrene equivalent weight average molecular weight of the thermoplastic resin is measured by the gel permeation chromatography (GPC) method. Specifically, the polystyrene equivalent weight average molecular weight of the thermoplastic resin can be determined at a column temperature of 40° C. using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and carrying out calculation using a calibration curve of standard polystyrene.

Examples of the phenoxy resin may include phenoxy resins having one or more skeletons selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethyl cyclohexane skeleton. A terminal of phenoxy resin may be any functional group such as a phenolic hydroxyl group and an epoxy group. The phenoxy resin may be used alone or in combination of two or more kinds thereof. Specific examples of the phenoxy resin may include "1256" and "4250" (both of which are a bisphenol A skeleton-containing phenoxy resin), "YX8100" (a bisphenol S skeleton-containing phenoxy resin), and "YX6954" (a bisphenol acetophenone skeleton-containing phenoxy resin) which are available from Mitsubishi Chemical Corporation. Additional examples thereof may include "FX280" and "FX293" which are available from Tohto Kasei Co., Ltd., and "YL7553," "YL6794," "YL7213," "YL7290," and "YL7482" which are available from Mitsubishi Chemical Corporation.

Specific examples of the polyvinyl acetal resin may include denkabutyral 4000-2, 5000-A, 6000-C, and 6000-EP which are available from DENKI KAGAKU KOGYO KABUSHIKI KAISHA, and S-LEC BH series, BX series, KS series, BL series, and BM series which are available from SEKISUI CHEMICAL CO., LTD.

Specific examples of the polyimide resin may include "RIKACOAT SN20" and "RIKACOAT PN20" which are available from New Japan Chemical Co., Ltd. Additionally, specific examples of the polyimide resin may include modified polyimides such as a linear polyimide obtained by reaction of a difunctional hydroxyl-terminated polybutadiene, a diisocyanate compound and a tetrabasic acid anhydride (described in JP-A-2006-37083, which is incorporated herein by reference in its entirety), and a polysiloxane skeleton-containing polyimide (described in JP-A-2002-12667 and JP-A-2000-319386, both of which are incorporated herein by reference in their entireties).

Specific examples of the polyamideimide resin may include "VYLOMAX HR11NN" and "VYLOMAX HR16NN" which are available from TOYOBO CO., LTD. Additionally, specific examples of the polyamideimide resin may include modified polyamideimides such as polysiloxane skeleton-containing polyamideimide "KS9100" and "KS9300" which are available from Hitachi Chemical Company, Ltd.

Specific examples of the polyethersulfone resin may include "PES5003P" available from Sumitomo Chemical Co., Ltd.

Specific examples of the polysulfone resin may include polysulfones "P1700" and "P3500" which are available from Solvay Advanced Polymers K.K.

The content of the thermoplastic resin in the resin composition is preferably 0.1% by mass to 20% by mass. When the content of the thermoplastic resin falls within such a range, the viscosity of the resin composition is moderate, and therefore a resin composition having uniform thickness and bulk properties can be formed. The content of the thermoplastic resin in the resin composition is more preferably 0.5% by mass to 10% by mass.

Examples of the accelerator may include an organic phosphine compound, an imidazole compound, an amine adduct compound, and a tertiary amine compound. The accelerator is preferably used so that the content thereof falls within a range of 0.05% by mass to 3% by mass when total content of nonvolatile components in the epoxy resin (a) and the curing agent (b) is defined as 100% by mass. The accelerator may be used alone or in combination of two or more kinds thereof.

Examples of the flame retardant may include an organic phosphorus-based flame retardant, an organic nitrogen-containing phosphorus compound, a nitrogen compound, a silicone-based flame retardant, and a metal hydroxide. The flame retardant may be used alone or in combination of two or more kinds thereof. Although the content of the flame retardant in the resin composition is not particularly limited, it is preferably 0.5% by mass to 10% by mass, more preferably 1% by mass to 9% by mass, and still more preferably 1% by mass to 8% by mass.

The rubber particle which may be used in the present invention is, for example, one which is insoluble in a solvent described below and is incompatible with the above epoxy resin, curing agent and thermoplastic resin. In general, such a rubber particle can be prepared by increasing the molecular weight of a rubber component to such an extent that it is insoluble in the solvent and the resin, and converting it into a granular state.

Examples of the rubber particle may include a core-shell type rubber particle, a crosslinked acrylonitrile butadiene rubber particle, a crosslinked styrene butadiene rubber particle, and an acrylic rubber particle. The core-shell type rubber particle is a rubber particle having a core layer and a shell layer, and examples thereof may include a two-layer structure in which the shell layer as an external layer is made of a glassy polymer and the core layer as an internal layer is made of a rubbery polymer; and a three-layer structure in which the shell layer as an external layer is made of a glassy polymer, an intermediate layer is made of a rubbery polymer, and the core layer is made of a glassy polymer. The glassy polymer layer is made of, for example, a methyl methacrylate polymer, and the rubbery polymer layer is made of, for example, a butyl acrylate polymer (butyl rubber). The rubber particle may be used alone or in combination of two or more kinds thereof.

The average particle diameter of the rubber particle is preferably within a range of 0.005 μm to 1 μm, and more preferably within a range of 0.2 μm to 0.6 μm. The average particle diameter of the rubber particles can be measured using a dynamic light scattering method. For example, the measurement can be carried out by uniformly dispersing the rubber particles in an appropriate organic solvent by ultrasonic wave or the like, preparing the particle size distribution of the rubber particle using a concentrated system particle size analyzer (FPAR-1000, manufactured by Otsuka Electronics Co., Ltd.) on the mass basis, and defining its median diameter as the average particle diameter. The content of the rubber particle in the resin composition is preferably 1% by mass to 10% by mass, and more preferably 2% by mass to 5% by mass.

The resin composition used for the resin composition layer may contain other additives, if necessary. Examples of the other additives may include an organometallic compound such as an organic copper compound, an organic zinc compound and an organic cobalt compound, and a resin additive such as an organic filler, a thickener, an antifoaming agent, a leveling agent, an adhesion-imparting agent, a coloring agent, and a curable resin.

In the resin sheet with a support, the thickness of the resin composition layer is preferably 3 μM to 100 μm, more preferably 5 μm to 80 μm, and still more preferably 20 μm to 60 μM.

In the resin sheet with a support, the resin composition layer may have a multiple-layered structure of two or more layers. When the resin composition layer having a multiple-layered structure is used, the total thickness preferably falls within the above-described range.

The resin sheet with a support can be prepared by forming a resin composition layer on a support.

The resin composition layer can be formed on the support by the known method. For example, the resin composition layer can be formed by preparing a resin varnish in which a resin composition is dissolved in a solvent, applying the resin varnish to the surface of a support with a die coater or the like, and drying the resin varnish.

Examples of the solvent used for preparing the resin varnish may include a ketone-based solvent such as acetone, methyl ethyl ketone and cyclohexanone; an acetate ester-based solvent such as ethyl acetate, butyl acetate, cellosolve acetate, propylene glycol monomethyl ether acetate and carbitol acetate; a carbitol-based solvent such as cellosolve and butyl carbitol; an aromatic hydrocarbon-based solvent such as toluene and xylene; and an amide-based solvent such as dimethylformamide, dimethylacetamide, and N-methylpyrrolidone. The solvent may be used alone or in combination of two or more kinds thereof.

The resin varnish may be dried by the known drying methods such as heating and blowing hot air. A large amount of solvent remaining in the resin composition layer causes a blister after curing. Therefore, the resin varnish is dried so that the amount of solvent remaining in the resin composition is generally 10% by mass or less, and preferably 5% by mass or less. Drying condition varies depending on the boiling point of the organic solvent in the resin varnish. For example, when a resin varnish containing 30% by mass to 60% by mass solvent is used, the resin varnish can be dried at 50° C. to 150° C. for 3 to 10 minutes to form a resin composition layer.

In the resin sheet with a support, a protective film corresponding to the support can be further laminated on the surface of the resin composition layer with which the support is not in contact (that is, the surface on a side opposite to the support). Although the thickness of the protective film is not particularly limited, it is, for example, 1 μm to 40 μm. When the protective film is laminated, attachment of dust or the like or generation of scratches on the surface of the resin composition layer can be prevented. The resin sheet with a support can be wound into a roll form and stored. In production of a printed wiring board, the resin sheet with a support can be used by peeling off the protective film.

Since such a resin sheet with a support results in an insulating layer having a surface with low roughness and excellent adhesion strength to a conductive layer, the resin sheet with a support is useful for an insulating layer of a printed wiring board, and particularly for an interlayer insulating layer.

Hereinafter, each step will be described.

Step (A).

In the step (A), a resin sheet with a support which includes a support and a resin composition layer in contact with the support is laminated onto an internal layer circuit substrate so that the resin composition layer is in contact with the internal layer circuit substrate.

The configuration of the resin sheet with a support used in the step (A) is as described above. The "internal layer circuit substrate" refers to an intermediate product that has a patterned conductive layer (circuit) on one or both surfaces of a substrate such as a glass epoxy substrate, a metal substrate, a polyester substrate, a polyimide substrate, a BT resin substrate and a thermosetting polyphenylene ether substrate, and that an insulating layer and a conductive layer are further to be formed thereon in the production of a printed wiring board.

In the step (A), the lamination of the resin sheet with a support onto the internal layer circuit substrate may be carried out by any conventionally known method. In particular, it is preferable that the resin sheet with a support is laminated by a roll or press compression bonding so that the resin composition layer thereof is in contact with the internal layer circuit substrate. It is more preferable that the resin sheet with a support is laminated by a vacuum lamination method in which the lamination is performed under reduced pressure. The lamination method may be a method of batch mode or of continuous mode.

In general, it is preferable that the lamination is carried out under the following condition: a compression bonding pressure within a range of 1 kgf/cm$^2$ to 11 kgf/cm$^2$ (0.098 MPa to 1.078 MPa); a compression bonding temperature within a range of 70° C. to 120° C.; a compression bonding time within a range of 5 seconds to 180 seconds; and under a reduced pressure at air pressure of 20 mmHg (26.7 hPa) or less.

The lamination can be performed using a commercially available vacuum laminator. Examples of the commercially available vacuum laminator may include a vacuum pressure laminator manufactured by Meiki Co., Ltd., and a vacuum applicator manufactured by Nichigo-Morton Co., Ltd.

In the step (A), the resin sheet with a support may be laminated onto one side or onto both sides of the internal layer circuit substrate.

Step (B).

In the step (B), the resin composition layer of the resin sheet with a support is thermally cured to form an insulating layer.

The condition for thermally curing the resin composition layer is not particularly limited, and there may be used a condition which is generally used in formation of an insulating layer of a printed wiring board.

The condition for thermally curing the resin composition layer varies depending on the kinds or the like of the resin composition. For example, a curing temperature can be set within a range of 120° C. to 240° C. (preferably within a range of 150° C. to 210° C., and more preferably within a range of 170° C. to 190° C.) and a curing time can be set within a range of 5 minutes to 90 minutes (preferably within a range of 10 minutes to 75 minutes, and more preferably within a range of 15 minutes to 60 minutes).

Before thermally curing the resin composition layer, the resin composition layer may be preheated at a temperature lower than the curing temperature. For example, before thermally curing the resin composition layer, the resin composition layer may be preheated at a temperature of 50° C. or higher and lower than 120° C. (preferably 60° C. or higher and 110° C. or lower, and more preferably 70° C. or higher and 100° C. or lower) for 5 minutes or more (preferably 5 minutes to 150 minutes, and more preferably 15 minutes to 120 minutes).

Step (C).

In the step (C), the insulating layer is perforated to form a via hole.

A via hole is provided for electrical connection between layers, and in consideration of characteristics of the insulating layer, can be formed by a known method using drill, laser, plasma, or the like. For example, a via hole can be formed in the insulating layer by irradiation of laser light from the support side. The size of the opening of the via hole is selected depending on the fineness of a module to be loaded, and the top diameter is preferably within a range of 40 μm to 500 μm.

Examples of the laser light source may include a carbon dioxide gas laser, a YAG laser, and an excimer laser. Among them, a carbon dioxide gas laser is preferable from the viewpoints of processing speed and cost.

When a carbon dioxide gas laser device is used as a laser light source, laser light with a wavelength of 9.3 μm to 10.6 μm is generally used. The shot number varies depending on the depth and diameter of the via hole to be formed, and is generally selected from a range of 1 to 10 shots. From the viewpoint of improving the productivity of a printed wiring board by enhancing a processing speed, it is preferable that the shot number is low. The shot number is preferably within a range of 1 to 5, and more preferably within a range of 1 to 3. When the shot number is two or more, laser light may be irradiated in either a burst mode or a cycle mode.

The energy of laser light depends on the shot number, the depth of the via hole and the thickness of a support. When a carbon dioxide gas laser device is used as a laser light source, the energy of laser light is set to preferably 0.25 mJ or more, more preferably 0.5 mJ or more, and still more preferably 1 mJ or more. The upper limit of the energy of laser light is preferably 20 mJ or less, more preferably 15 mJ or less, and still more preferably 10 mJ or less.

The perforation can be performed using a commercially available laser device. Examples of a commercially available carbon dioxide gas laser device may include LC-2E21B/1C manufactured by Hitachi Via Mechanics, Ltd., ML605GTWII manufactured by Mitsubishi Electric Corporation, and a laser processing machine for perforating substrate manufactured by Matsushita Welding Systems Co., Ltd.

Step (D).

In the step (D), a desmear treatment is performed.

In general, a resin residue (smear) is attached to the inside of the via hole formed in the step (C) (particularly, a bottom of the via hole). The smear causes failure of electrical connection between layers, and therefore a treatment of removing the smear (desmear treatment) is performed in the step (D).

In a method for producing a multi-layered printed wiring board of the present invention, the desmear treatment is performed in a state that the support is attached to the insulating layer. Unlike the conventional techniques in which the desmear treatment is performed after peeling the support, the surface of the insulating layer is protected by the support. Therefore, the smear inside the via hole can be removed without roughening the surface of the insulating layer. Since there is no restriction where the surface of the insulating layer is damaged, a variety of methods and conditions for desmear treatment can be adopted. Therefore, even when a resin composition containing an active ester-based curing agent resulting in formation of a resin residue (smear) which is difficult to be removed in a desmear treatment is used as a resin composition for forming an insulating layer, the smear can be effectively removed without an increase in roughness of the surface of the insulating layer.

In the step (D), the desmear treatment is not particularly limited, and can be performed by various known methods. In one embodiment, the desmear treatment may be a dry desmear treatment, a wet desmear treatment, or a combination thereof.

Examples of the dry desmear treatment may include a desmear treatment using plasma. In the desmear treatment using plasma, it is known that the adhesion strength between an insulating layer and a conductive layer is likely to be reduced due to modification of the surface of the insulating layer by plasma. However, in the method of the present invention in which a desmear treatment is performed in a state that a support is attached to an insulating layer, the desmear treatment can be advantageously performed without modification of the surface of the insulating layer.

The desmear treatment using plasma can be performed using a commercially available plasma desmear treatment device. Among commercially available desmear treatment devices, suitable examples for producing a printed wiring board may include a microwave plasma device manufactured by Nissin Inc., and a normal-pressure plasma etching device manufactured by SEKISUI CHEMICAL CO., LTD.

As the dry desmear treatment, there may also be used a dry sand blasting treatment in which a subject to be treated can be ground by spraying an abrasive material from a nozzle. The dry sand blasting treatment can be performed using a commercially available dry sand blasting treatment device. When a water-soluble abrasive material is used as the abrasive material, a smear can be effectively removed without the abrasive material remaining inside the via hole by washing with water after the dry sand blasting treatment.

Examples of the wet desmear treatment may include a desmear treatment using an oxidant solution. In the desmear treatment using an oxidant solution, it is preferable that a swelling treatment with a swelling solution, an oxidation treatment with an oxidant solution, and a neutralization treatment with a neutralization solution is performed in this order. Examples of the swelling solution may include "Swelling Dip Securiganth P" and "Swelling Dip Securiganth SBU" which are available from Atotech Japan K.K. It is preferable that the swelling treatment is performed by immersing the substrate in which the via hole is formed in a swelling solution heated at 60° C. to 80° C. for 5 minutes to 10 minutes. The oxidant solution is preferably an aqueous solution of alkaline permanganate, and examples thereof may include a solution in which potassium permanganate or sodium permanganate is dissolved in an aqueous solution of sodium hydroxide. It is preferable that the oxidation treatment by an oxidant solution is performed by immersing the substrate after the swelling treatment in the oxidant solution heated at 60° C. to 80° C. for 10 minutes to 30 minutes. Examples of a commercially available aqueous solution of alkaline permanganate may include "Concentrate Compact P," "Concentrate Compact CP," and "Dosing Solution Securiganth P" which are available from Atotech Japan K.K. It is preferable that the neutralization treatment by a neutralization solution is performed by immersing the substrate after the oxidation treatment in the neutralization solution heated at 30° C. to 50° C. for 3 minutes to 10 minutes. The neutralization solution is preferably an acidic aqueous solution, and examples of a commercially available product thereof may include "Reduction Solution Securiganth P" available from Atotech Japan K.K.

As the wet desmear treatment, there may also be used a wet sand blasting treatment in which a subject to be treated can be ground by spraying an abrasive material and a dispersion medium from a nozzle. The wet sand blasting treatment can be performed using a commercially available wet sand blasting treatment device.

When the dry desmear treatment and the wet desmear treatment are used in combination, the dry desmear treatment may be performed first or the wet desmear treatment may be performed first.

Step (E).

In the step (E), the support is peeled. Thus, the surface of the insulating layer is exposed.

The support may be peeled by hand or mechanically with an automated peeling device. When a metal foil is used as the support, the metal foil may be removed by etching with an etching solution.

During the desmear treatment in the step (D), the surface of the insulating layer is protected by the support. Therefore, the surface of the insulating layer which comes to be exposed in this step advantageously has a low roughness (a roughness value of the surface of the insulating layer will be described below).

Step (F).

In the step (F), a conductive layer is formed on the surface of the insulating layer.

The conductive material used for the conductive layer is not particularly limited. In a preferred embodiment, the conductive layer contains one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. Examples of the alloy layer may include layers formed of an alloy of two or more metals selected from the above-described group (for example, a nickel-chromium alloy, a copper-nickel alloy, and a copper-titanium alloy). In particular, from the viewpoints of versatility and cost of forming a conductive layer and ease of patterning, the conductive layer is preferably a single metal layer of chromium, nickel, titanium, aluminum, zinc, gold, palladium, silver or copper, or an alloy layer of a nickel-chromium alloy, a copper-nickel alloy or a copper-titanium alloy, and more preferably a single metal layer of chromium, nickel, titanium, aluminum, zinc, gold, palladium, silver or copper, or an alloy layer of a nickel-chromium alloy, and still more preferably a single metal layer of copper.

The conductive layer may have a single-layer structure or a multiple-layered structure in which two or more layers of a single metal layer or an alloy layer formed of different kinds of metals or alloy are layered. When the conductive layer has a multiple-layered structure, it is preferable that a layer in contact with the insulating layer is a single metal layer of chromium, zinc or titanium, or an alloy layer of a nickel-chromium alloy.

Although the thickness of the conductive layer depends on a desired design of a printed wiring board, it is generally 3 μm to 35 μm, and preferably 5 μm to 30 μm.

The conductive layer can be formed on the surface of the insulating layer by various conventionally known methods such as a full-additive method and a semi-additive method.

In one embodiment, the step (F) includes performing a roughening treatment of the surface of the insulating layer, and wet plating the surface of the insulating layer to form a conductive layer, in this order. Hereinafter, such a step is referred to as "step (F-1)".

Examples of the roughening treatment may include a dry roughening treatment and a wet roughening treatment. A roughening treatment may also be performed by a combination thereof.

The dry roughening treatment may be performed in the same manner as the dry desmear treatment as described above. The wet roughening treatment may be performed in the same manner as the wet desmear treatment as described above.

When the dry roughening treatment and the wet roughening treatment are performed in combination, the dry roughening treatment may be performed first or the wet roughening treatment may be performed first.

Although the roughening treatment is directed to roughening of an exposed surface of the insulating layer, it has a certain effect for removal of a smear inside a via hole. Therefore, even when the step (D) is performed under mild condition, a residual smear can be prevented.

In the step (F-1), the surface of the insulating layer is subjected to the roughening treatment, and then wet plated to form a conductive layer.

For example, a conductive layer having desired wiring pattern can be formed by wet plating the surface of the insulating layer by various conventionally known methods such as a semi-additive method and a full-additive method. Hereinafter, an example of forming a conductive layer by the semi-additive method will be described.

Firstly, a plating seed layer is formed on the surface of the insulating layer by electroless plating. Subsequently, on the formed plating seed layer, a mask pattern is formed that exposes a portion of the plating seed layer corresponding to desired wiring pattern. A metal layer is formed on the exposed plating seed layer by electrolytic plating, and then the mask pattern is removed. After that, an unnecessary plating seed layer can be removed by etching or the like to form a conductive layer having desired wiring pattern.

In another embodiment, the step (F) includes dry plating the surface of the insulating layer to form a metal layer, and wet plating the surface of the metal layer to form a conductive layer, in this order. Hereinafter, such a step is referred to as "step (F-2)".

In the step (F-2), a metal layer is firstly formed by dry plating the surface of the insulating layer. Examples of the dry plating may include physical vapor deposition (PVD) such as vacuum deposition, sputtering, ion plating and laser ablation, and chemical vapor deposition (CVD) such as thermal CVD and plasma CVD. Among them, deposition and sputtering are preferable. The metal layer may be formed by two kinds of the dry plating in combination.

Subsequently, using the formed metal layer as a plating seed layer, the metal layer can be wet plated by the semi-additive method to form a conductive layer.

In the step (F-2), sufficient adhesion strength between the insulating layer and the conductive layer can be achieved without a roughening treatment of the surface of the insulating layer. However, the surface of the insulating layer may be subjected to the roughening treatment. In this case, the step (F-2) includes performing a roughening treatment of the surface of the insulating layer, dry plating the surface of the insulating layer to form a metal layer, and wet plating the surface of the metal layer to form a conductive layer, in this order.

In the method for producing a printed wiring board of the present invention, an insulating layer (interlayer insulating layer) having low roughness and high adhesion strength to a conductive layer can be formed, and in addition, excellent performance in removal of smear can be provided. The method for producing a printed wiring board of the present invention significantly contributes to formation of finer wiring of the printed wiring board without causing a failure of electrical connection between layers.

Printed Wiring Board.

For a printed wiring board produced by the method of the present invention, the arithmetic average roughness (Ra) of the surface of the insulating layer is preferably 180 nm or less, more preferably 140 nm or less, still more preferably 100 nm or less, and particularly preferably 90 nm or less, 80 nm or less, 70 nm or less, or 60 nm or less. Although the lower limit of the Ra value is not particularly limited, it is preferably 0.5 nm or more, and more preferably 1 nm or more. The root mean square roughness (Rq) of the surface of the insulating layer is preferably 250 nm or less, more preferably 200 nm or less, still more preferably 150 nm or less, and particularly preferably 130 nm or less, 110 nm or less, or 90 nm or less. Although the lower limit of the Rq value is not particularly limited, it may be 10 nm or more, 30 nm or more, or the like, for stabilization of the adhesion strength to a conductive layer.

The arithmetic average roughness (Ra) and root mean square roughness (Rq) of the surface of the insulating layer can be measured using a non-contact type surface roughness meter. Specific examples of the non-contact type surface roughness meter may include "WYKO NT3300" manufactured by Veeco Instruments Inc.

The printed wiring board produced by the method of the present invention is provided with a conductive layer having a sufficient adhesion strength (peel strength) of preferably 0.4 kgf/cm or more, more preferably 0.45 kgf/cm or more, and still more preferably 0.5 kgf/cm or more, despite that a surface of an insulating layer therein has low roughness as described above. It is preferable that the peel strength is high, and an upper limit of the peel strength is generally 1.5 kgf/cm.

The peel strength of the insulating layer and the conductive layer can be measured in accordance with JIS C6481.

Semiconductor Device.

A semiconductor device can be manufactured using the printed wiring board produced by the method of the present invention. Examples of such a semiconductor device may include various semiconductor devices used in electrical products (for example, a computer, a cellular phone, a digital camera, and a television), and vehicles (for example, a motorcycle, an automobile, a train, a ship, and an airplane).

Other features of the invention will become apparent in the course of the following descriptions of exemplary embodiments which are given for illustration of the invention and are not intended to be limiting thereof.

EXAMPLES

In the following description, "parts" and "%" represent "parts by mass" and "% by mass," respectively, unless otherwise specified.

Various measurement methods and evaluation methods will be described first.

Preparation of Sample for Measurement and Evaluation.

(1) Pretreatment of Internal Layer Circuit Substrate.

Both sides of a double-sided copper clad laminate with an epoxy resin-glass cloth base material in which an internal layer circuit was formed (thickness of copper foil: 18 μm, substrate thickness: 0.3 mm, "R5715ES" manufactured by Matsushita Electric Works, Ltd.), were etched to a depth of 1 μm by "CZ8100" available from Mec Co., Ltd., whereby the copper surface was subjected to a roughing treatment.

(2) Lamination of Resin Sheet with Support.

Each resin sheet with a support prepared in Examples and Comparative Examples was laminated onto both sides of the internal layer circuit substrate using a batch-type vacuum pressure laminator ("MVLP-500" manufactured by Meiki Co., Ltd.) so that the resin composition layer is in contact with the internal layer circuit substrate. The lamination was carried out by reducing the pressure for 30 seconds to an air pressure of 13 hPa or lower and then performing a lamination treatment for 30 seconds at 100° C. under a pressure of 0.74 MPa.

(3) Curing of Resin Composition.

The laminated resin sheet with a support was heated at 80° C. for 30 minutes and then at 170° C. for 30 minutes, whereby the resin composition layer was thermally cured to form an insulating layer.

(4) Formation of Via Hole.

The insulating layer was perforated from the support side using a $CO_2$ laser processing machine "LC-2E21B/1C" manufactured by Hitachi Via Mechanics, Ltd., to form a via hole. The top diameter (diameter) of the via hole in the insulating layer surface was 50 μm. A perforating condition included a mask diameter of 1.60 mm, a focus offset value of 0.050, a pulse width of 25 μs, an energy of 0.33 mJ/shot (power: 0.66 W, frequency: 2,000 Hz), an aperture of 13, a shot number of 2, and a burst mode.

(5) Desmear Treatment.

After the formation of the via hole, the internal layer circuit substrate having the insulating layer formed thereon was subjected to a desmear treatment in the state that the support was still attached thereto. For the substrate after the desmear treatment, the performance in removal of smear at the bottom of via hole was evaluated. As the desmear treatment, a wet desmear treatment or a dry desmear treatment, as described below, was performed.

Wet Desmear Treatment:

The internal layer circuit substrate having the insulating layer formed thereon was immersed in a swelling solution ("Swelling Dip Securiganth P" available from Atotech Japan K.K., aqueous solution of diethylene glycol monobutyl ether and sodium hydroxide) at 60° C. for 5 minutes, an oxidant solution ("Concentrate Compact P" available from Atotech Japan K.K., aqueous solution of about 6% potassium permanganate and about 4% sodium hydroxide) at 80° C. for 20 minutes, and finally a neutralization solution ("Reduction Solution Securiganth P" available from Atotech Japan K.K., aqueous solution of sulfuric acid) at 40° C. for 5 minutes. Then, the substrate was dried at 80° C. for 15 minutes.

Dry Desmear Treatment:

The internal layer circuit substrate having the insulating layer formed thereon was treated for 5 minutes under conditions of $O_2/CF_4$ (mixed gas ratio) of 25/75 and a degree of vacuum of 100 Pa using a vacuum plasma etching device (100-E PLASMA SYSTEM manufactured by Tepla).

(6) Peeling of Support.

The support was peeled to expose the surface of the insulating layer.

(7) Formation of Conductive Layer.

A conductive layer was formed on the exposed surface of the insulating layer. The conductive layer was formed by a wet method or a dry method as described below. The wet method and the dry method correspond to the above-mentioned steps (F-1) and (F-2), respectively.

Wet Method:

The internal circuit substrate having the insulating layer formed thereon was immersed in a swelling solution ("Swelling Dip Securiganth P" available from Atotech Japan K.K., aqueous solution of diethylene glycol monobutyl ether and sodium hydroxide) at 60° C. for 10 minutes, a roughening solution ("Concentrate Compact P" available from Atotech Japan K.K., aqueous solution of about 6% potassium permanganate and about 4% sodium hydroxide) at 80° C. for 20 minutes, and finally a neutralization solution ("Reduction Solution Securiganth P" available from Atotech Japan K.K., aqueous solution of sulfuric acid) at 40° C. for 5 minutes. Then, the substrate was dried at 80° C. for 30 minutes. The dried substrate was referred to as "evaluation substrate A."

After that, the evaluation substrate A was immersed in a PdCl$_2$-containing electroless plating solution at 40° C. for 5 minutes and then immersed in an electroless copper plating liquid at 25° C. for 20 minutes. The resultant substrate was subjected to an annealing treatment by heating at 150° C. for 30 minutes. Thereafter, a conductive layer having a thickness of 25 μm was formed in accordance with the semi-additive method by forming an etching resist, patterning the etching resist by exposure and development, and electroplating with copper sulfate. After formation of a conductive pattern, an annealing treatment was performed by heating at 190° C. for 60 minutes. The resultant printed wiring board was referred to as "evaluation substrate B."

Dry Method:

In the dry method, the substrate in which the surface of the insulating layer was exposed by peeling off the support was referred to as "evaluation substrate A." On the evaluation substrate A, a titanium layer (thickness: 30 nm) and then a copper layer (thickness: 300 nm) were formed with a sputtering device ("E-400S" manufactured by CANON ANELVA CORPORATION). The resultant substrate was subjected to an annealing treatment by heating at 150° C. for 30 minutes. Thereafter, a conductive layer having a thickness of 25 μm was formed in accordance with the semi-additive method by forming an etching resist, patterning the etching resist by exposure and development, and electroplating with copper sulfate. After formation of a conductive pattern, an annealing treatment was performed by heating at 190° C. for 60 minutes. The resultant printed wiring board was referred to as "evaluation substrate B."

Measurement and Evaluation of Arithmetic Mean Roughness (Ra Value) and Root Mean Square Roughness (Rq Value).

For the evaluation substrate A, an Ra value and an Rq value were determined from numerical values obtained in a measurement region of 121 μm×92 μm in a VSI contact mode with a 50-times lens using a non-contact type surface roughness meter ("WYKO NT3300" manufactured by Veeco Instruments Inc.). Each value was determined by calculating an average value at 10 points randomly selected.

Measurement of Adhesion Strength (Peel Strength) Between Insulating Layer and Conductive Layer.

The peel strength between the insulating layer and the conductive layer was measured for the evaluation substrate B in accordance with JIS C6481. Specifically, a cut was made in a portion of 10 mm in width and 100 mm in length of the conductive layer of the evaluation substrate B, one end thereof was peeled and grasped by a grasping tool, and a load (kgf/cm) at the time of peeling to an extent of 35 mm in a vertical direction at a rate of 50 mm/min at room temperature was measured as the peel strength. In the measurement, a tensile testing device ("AC-50C-SL" manufactured by TSE Co., Ltd.) was used.

Evaluation of Performance in Removal of Smear.

The surroundings of the bottom of the via hole were observed with a scanning electron microscope (SEM) and a maximum smear length from a wall surface of the bottom of the via hole was measured based on the obtained image. The performance in removal of smear was evaluated in accordance with the following criteria.

Criteria for Evaluation:
- ○: the maximum smear length was less than 3 μm
- x: the maximum smear length was 3 μm or more Preparation Example 1

(1) Preparation of Resin Varnish 1.

5 parts of bisphenol type epoxy resin (epoxy equivalent weight: about 165, "ZX1059" available from Nippon Steel Chemical Co., Ltd., mixed product of bisphenol A type and bisphenol F type epoxy resins in a ratio of 1:1), 10 parts of bixylenol type epoxy resin (epoxy equivalent weight: about 185, "YX4000HK" available from Mitsubishi Chemical Corporation), 10 parts of biphenyl type epoxy resin (epoxy equivalent weight: about 290, "NC3000H" available from NIPPON KAYAKU Co., Ltd.), and 10 parts of phenoxy resin ("YL7553BH30" available from Mitsubishi Chemical Corporation, methyl ethyl ketone (MEK) solution of 30% by mass of solid content) were dissolved by heating in 20 parts of solvent naphtha with stirring. After cooling to room temperature, 18 parts of naphthol-based curing agent (hydroxyl group equivalent weight: 215, "SN-485" available from Nippon Steel Chemical Co., Ltd., MEK solution of 60% solid content), 6 parts of triazine-containing phenol novolac-based curing agent (hydroxyl group equivalent weight: 146, "LA-1356" available from DIC Corporation, MEK solution of 60% solid content), 4 parts of accelerator (4-dimethylaminopyridine (DMAP), MEK solution of 2% by mass of solid content), 2 parts of flame retardant ("HCA-HQ" available from SANKO CO., LTD., 10-(2,5-dihydroxyphenyl)-10-hydro-9-oxa-10-phosphaphenanthrene-10-oxide, average particle diameter: 2 μm), and 120 parts of spherical silica (average particle diameter: 0.5 μm, "SOC2" available from Admatechs Company Limited., amount of carbon per unit area: 0.39 mg/m$^2$) surface-treated with an aminosilane-based coupling agent ("KBM573" available from Shin-Etsu Chemical Co., Ltd.) were mixed thereto. The mixture was uniformly dispersed with a high-speed rotary mixer, thus preparing a resin varnish 1.

(2) Preparation of Resin Sheet with Support 1.

As a support, a PET film ("AL5" available from Lintec Corporation, thickness: 38 μm) release-treated with an alkyd resin-based release agent was prepared. The resin varnish 1 was applied to a release layer side of the support with a die coater, and dried at 180° C. to 120° C. (100° C. on average) for 5 minutes to form a resin composition layer 1. The thickness of the resin composition layer 1 was 30 μm. Thereafter, on a surface of the resin composition layer 1 which was not in contact with the support, a polypropylene film ("ALPHAN MA-411" available from Oji Specialty Paper Co., Ltd., thickness: 15 μm) on a smooth face side was stuck as a protective film, thus obtaining a resin sheet with a support 1 having a layer structure of protective film/resin composition layer 1/support.

Preparation Example 2

(1) Preparation of Resin Varnish 2.

5 parts of bisphenol type epoxy resin (epoxy equivalent weight: about 165, "ZX1059" available from Nippon Steel Chemical Co., Ltd., mixed product of bisphenol A type and bisphenol F type epoxy resins in a ratio of 1:1), 10 parts of bixylenol type epoxy resin (epoxy equivalent weight: about 185, "YX4000HK" available from Mitsubishi Chemical Corporation), 10 parts of biphenyl type epoxy resin (epoxy equivalent weight: about 290, "NC3000H" available from NIPPON KAYAKU Co., Ltd.), and 10 parts of phenoxy resin ("YL7553BH30" available from Mitsubishi Chemical Corporation, MEK solution of 30% by mass of solid content) were dissolved by heating in 30 parts of solvent naphtha with stirring. After cooling to room temperature, 20 parts of active ester compound (active group equivalent weight: about 223, "HPC8000-65T" available from DIC Corporation, toluene solution of 65% by mass of nonvolatile component), 12 parts of naphthol-based curing agent (hydroxyl group equivalent weight: 215, "SN-485" available from Nippon Steel Chemical Co., Ltd., MEK solution of 60% solid content), 4 parts of curing accelerator (4-dimethylaminopyridine (DMAP), MEK solution of 2% by mass of solid content), 2 parts of flame retardant ("HCA-HQ" available from SANKO CO., LTD., 10-(2,5-dihydroxyphenyl)-10-hydro-9-oxa-10-phosphaphenanthrene-10-oxide, average particle diameter: 2 μm), and 150 parts of spherical silica (average particle diameter: 0.5 μm, "SOC2" available from Admatechs Company Limited., amount of carbon per unit area: 0.39 mg/m$^2$) surface-treated with an aminosilane-based coupling agent ("KBM573" available from Shin-Etsu Chemical Co., Ltd.) were mixed thereto. The mixture was uniformly dispersed with a high-speed rotary mixer, thus preparing a resin varnish 2.

(2) Preparation of Resin Sheet with Support 2.

A resin sheet with a support 2 having a layer structure of protective film/resin composition layer 2/support was obtained in the same manner as in Preparation Example 1 using the resin varnish 2 prepared in (1) above.

Compositions of the resin composition layers of the resin sheet with a support 1 and 2 are summarized in Table 1.

TABLE 1

| | | | | Resin sheet with support | |
|---|---|---|---|---|---|
| | | | | 1 | 2 |
| Resin composition layer | Blending components (parts by mass*) | Epoxy resin | ZX1059 | 5 | 5 |
| | | | YX4000HK | 10 | 10 |
| | | | NC3000H | 10 | 10 |
| | | Curing agent | HPC8000-65T | | 13 |
| | | | LA-1356 | 3.6 | |
| | | | SN485 | 10.8 | 7.2 |
| | | Inorganic filler | SOC2 | 120 | 150 |
| | | Accelerator | DMAP | 0.08 | 0.08 |
| | | Thermoplastic resin | YL7553BH30 | 3 | 3 |
| | | Flame retardant | HCA-HQ | 2 | 2 |
| | | Total | | 164.48 | 200.28 |
| | Inorganic filler content (% by mass) | | | 73.0 | 74.9 |

*In terms of non-volatile component

Example 1

A printed wiring board was produced using the resin sheet with a support 1 in accordance with "Preparation of sample for measurement and evaluation" as described above. In Example 1, the dry desmear treatment was performed as the desmear treatment and the conductive layer was formed by the dry method. Each evaluation result is shown in Table 2.

Example 2

A printed wiring board was produced using the resin sheet with a support 2 in accordance with "Preparation of sample for measurement and evaluation" as described above. In Example 2, the wet desmear treatment was performed as the desmear treatment and a conductive layer was formed by the wet method. Each evaluation result is shown in Table 2.

Example 3

A printed wiring board was produced using the resin sheet with a support 2 in accordance with "Preparation of sample for measurement and evaluation" as described above. In Example 3, the dry desmear treatment was performed as the desmear treatment and a conductive layer was formed by the wet method. Each evaluation result is shown in Table 2.

Comparative Example 1

A printed wiring board was produced in the same manner as in Example 1 except that the order of (5) desmear treatment and (6) peeling of support was changed in the procedure of "Preparation of sample for measurement and evaluation". Each evaluation result is shown in Table 2. In Comparative Example 1, a substrate after the dry desmear treatment was used as "evaluation substrate A."

Comparative Example 2

A printed wiring board was produced in the same manner as in Example 2 except that (5) desmear treatment was omitted in the procedure of "Preparation of sample for measurement and evaluation". Each evaluation result is shown in Table 2.

Comparative Example 3

A printed wiring board was produced in the same manner as in Example 2 except that the order of (5) desmear treatment and (6) peeling of support was changed in the procedure of "Preparation of sample for measurement and evaluation". Each evaluation result is shown in Table 2.

TABLE 2

| | Example | | | Comparative Example | | |
|---|---|---|---|---|---|---|
| | 1 | 2 | 3 | 1 | 2 | 3 |
| Resin sheet with support | 1 | 2 | 2 | 1 | 2 | 2 |
| Desmear step | Dry*[1] | Wet*[1] | Dry*[1] | Dry*[2] | | Wet*[2] |

TABLE 2-continued

|  |  | Example | | | Comparative Example | | |
|---|---|---|---|---|---|---|---|
|  |  | 1 | 2 | 3 | 1 | 2 | 3 |
| Conductive | layer forming step | Dry | Wet | Wet | Dry | Wet | Wet |
| Result of evaluation | Peel strength (kgf/cm) | 0.53 | 0.51 | 0.52 | 0.21 | 0.50 | 0.36 |
|  | Ra (nm) | 51 | 62 | 68 | 270 | 52 | 185 |
|  | Rq (nm) | 70 | 80 | 89 | 400 | 73 | 270 |
|  | Performance in removal of smear | ○ | ○ | ○ | ○ | x | ○ |

*[1]Dry or wet desmear treatment was performed in a state that a support was attached to an insulating layer
*[2]Dry or wet desmear treatment was performed after peeling off a support In Examples 1 to 3, in which the desmear treatment was performed when the support was attached to the insulating layer, it was confirmed that an insulating layer having a surface with low roughness and high adhesion strength (peel strength) to a conductive layer could be formed, and in addition, the excellent performance in removal of smear was achieved. On the other hand, in Comparative Examples 1 and 3, there were results in which the adhesion strength (peel strength) between the insulating layer and the conductive layer was low in spite that the roughness of the surface of the insulating layer was high, while in Comparative Example 2, a smear at the bottom of via hole could not be sufficiently removed.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method for producing a printed wiring board, comprising (A) to (F) in this order:
   (A) laminating, onto an internal layer circuit substrate, a resin sheet with a support which comprises a support and a resin composition layer in contact with the support, so that the resin composition layer is in contact with said internal layer circuit substrate;
   (B) thermally curing said resin composition layer of said resin sheet with a support to form an insulating layer;
   (C) perforating said insulating layer to form a via hole;
   (D) performing a desmear treatment;
   (E) peeling said support, to expose a surface of said insulating layer; and
   (F) forming a conductive layer on the surface of said insulating layer,
   wherein
   said resin composition layer of said resin sheet with a support comprises at least one epoxy resin, at least one curing agent, and at least one inorganic filler,
   said at least one curing agent comprises an active ester-based curing agent and a curing agent selected from the group consisting of a phenol-based curing agent and a naphthol-based curing agent,
   said at least one inorganic filler is treated with at least one surface treatment agent selected from the group consisting of an organosilazane compound, a titanate-based coupling agent, an aminosilane-based coupling agent, an epoxysilane-based coupling agent, and a mercaptosilane-based coupling agent, and
   said at least one inorganic filler is present in said resin composition layer in an amount of 72% by mass to 95% by mass, when a content of nonvolatile components in said resin composition layer is defined as 100% by mass.

2. A method for producing a printed wiring board according to claim 1, wherein said desmear treatment (D) is a wet desmear treatment, a dry desmear treatment, or a combination thereof.

3. A method for producing a printed wiring board according to claim 1, wherein said forming a conductive layer (F) comprises:
   performing a roughening treatment of the surface of said insulating layer, and
   wet plating said surface of the insulating layer to form said conductive layer, in this order.

4. A method for producing a printed wiring board according to claim 1, wherein said forming a conductive layer (F) comprises:
   dry plating the surface of said insulating layer to form a metal layer, and
   wet plating a surface of said metal layer to form said conductive layer, in this order.

5. A method for producing a printed wiring board according to claim 1, wherein said at least one inorganic filler has an average particle diameter of 0.01 μm to 3 μm.

6. A method for producing a printed wiring board according to claim 1, wherein a surface of said at least one inorganic filler is treated with a surface treatment agent.

7. A printed wiring board, which is produced by the method according to claim 1.

8. A semiconductor device, comprising a printed wiring board according to claim 7.

9. A method for producing a printed wiring board according to claim 1, wherein said forming a conductive layer (F) comprises:
   performing a roughening treatment of the surface of said insulating layer, the roughening treatment being selected from the group consisting of a dry sand blasting treatment, a wet sand blasting treatment and a desmear treatment using an oxidant solution.

10. A method for producing a printed wiring board according to claim 1, wherein said forming a conductive layer (F) comprises:
   (a) performing a roughening treatment of the surface of said insulating layer, said roughening treatment being a wet roughening treatment or a dry roughening treatment selected from the group consisting of a dry sand blasting treatment and a plasma treatment, and wet plating said surface of said insulating layer, in this order, to form said conductive layer; or (b) dry plating the surface of said insulating layer to form a metal layer without performing a roughening treatment, and wet a plating surface of said metal layer, in this order, to form said conductive layer.

* * * * *